United States Patent
Winniczek et al.

(10) Patent No.: US 9,018,098 B2
(45) Date of Patent: Apr. 28, 2015

(54) SILICON ETCH WITH PASSIVATION USING CHEMICAL VAPOR DEPOSITION

(75) Inventors: Jaroslaw W. Winniczek, Daly City, CA (US); Robert P. Chebi, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 616 days.

(21) Appl. No.: 12/257,215

(22) Filed: Oct. 23, 2008

(65) Prior Publication Data

US 2010/0105208 A1    Apr. 29, 2010

(51) Int. Cl.
*H01L 21/302* (2006.01)
*H01L 21/461* (2006.01)
*H01L 21/3065* (2006.01)
*H01J 37/32* (2006.01)
*H01L 21/3213* (2006.01)

(52) U.S. Cl.
CPC ....... *H01L 21/3065* (2013.01); *H01J 37/32082* (2013.01); *H01L 21/32137* (2013.01)

(58) Field of Classification Search
USPC .................................. 438/692, 695
See application file for complete search history.

(56) References Cited

U.S. PATENT DOCUMENTS

| | | | |
|---|---|---|---|
| 5,843,226 A | 12/1998 | Zhao et al. | |
| 5,904,520 A * | 5/1999 | Liaw et al. | 438/227 |
| 6,127,278 A | 10/2000 | Wang et al. | |
| 6,225,228 B1 * | 5/2001 | Srinivasan | 438/696 |
| 6,284,666 B1 | 9/2001 | Naeem et al. | |
| 6,303,512 B1 | 10/2001 | Laermer et al. | |
| 6,380,095 B1 * | 4/2002 | Liu et al. | 438/719 |
| 6,387,804 B1 | 5/2002 | Foster | |
| 6,458,648 B1 | 10/2002 | Molloy et al. | |
| 6,491,835 B1 | 12/2002 | Kumar et al. | |
| 7,129,178 B1 | 10/2006 | Schwarz et al. | |
| 7,135,396 B1 * | 11/2006 | Gabriel et al. | 438/612 |
| 7,169,255 B2 | 1/2007 | Yasui et al. | |

(Continued)

FOREIGN PATENT DOCUMENTS

| | | |
|---|---|---|
| JP | 8-115899 | 5/1996 |
| JP | 11-97414 | 4/1999 |

(Continued)

OTHER PUBLICATIONS

U.S. Appl. No. 12/338,950, filed Dec. 18, 2008.

(Continued)

*Primary Examiner* — Nadine Norton
*Assistant Examiner* — Mahmoud Dahimene
(74) *Attorney, Agent, or Firm* — Beyer Law Group LLP

(57) ABSTRACT

A silicon layer is etched through a patterned mask formed thereon using an etch chamber. A fluorine (F) containing etch gas and a silicon (Si) containing chemical vapor deposition gas are provided in the etch chamber. The fluorine (F) containing etch gas is used to etch features into the silicon layer, and the silicon (Si) containing chemical vapor deposition gas is used to form a silicon-containing deposition layer on sidewalls of the features. A plasma is generated from the etch gas and the chemical vapor deposition gas, and a bias voltage is provided. Features are etched into the silicon layer using the plasma, and a silicon-containing passivation layer is deposited on the sidewalls of the features which are being etched. Silicon in the passivation layer primarily comes from the chemical vapor deposition gas. The etch gas and the chemical vapor deposition gas are then stopped.

15 Claims, 6 Drawing Sheets

(56) References Cited

U.S. PATENT DOCUMENTS

| | | |
|---|---|---|
| 2002/0009891 A1 | 1/2002 | Ting et al. |
| 2002/0061621 A1 | 5/2002 | Grebs et al. |
| 2002/0179570 A1 | 12/2002 | Mathad et al. |
| 2003/0022512 A1 | 1/2003 | Saito et al. |
| 2003/0162407 A1 | 8/2003 | Maex et al. |
| 2003/0232504 A1 | 12/2003 | Eppler et al. |
| 2004/0221797 A1 | 11/2004 | Mosden et al. |
| 2004/0222190 A1 | 11/2004 | Horiguchi et al. |
| 2004/0241342 A1* | 12/2004 | Karim et al. ............... 427/585 |
| 2005/0014372 A1 | 1/2005 | Shimonishi et al. |
| 2005/0056941 A1 | 3/2005 | Vanhaelemeersch et al. |
| 2005/0126710 A1 | 6/2005 | Laermer et al. |
| 2005/0136682 A1* | 6/2005 | Hudson et al. ............ 438/714 |
| 2005/0142828 A1* | 6/2005 | Kammler et al. .......... 438/595 |
| 2005/0145341 A1 | 7/2005 | Suzuki |
| 2005/0158975 A1 | 7/2005 | Liu et al. |
| 2006/0219174 A1* | 10/2006 | Nguyen et al. ........... 118/723 R |
| 2006/0228860 A1 | 10/2006 | Shinohara et al. |
| 2007/0080136 A1 | 4/2007 | Takata et al. |
| 2007/0111467 A1 | 5/2007 | Kim |
| 2007/0232071 A1 | 10/2007 | Balseanu et al. |
| 2008/0020582 A1 | 1/2008 | Bai |
| 2008/0061029 A1 | 3/2008 | Lai et al. |

FOREIGN PATENT DOCUMENTS

| | | |
|---|---|---|
| JP | 11-111686 | 4/1999 |
| JP | 2000-509915 | 8/2000 |
| JP | 2001-319925 | 11/2001 |
| JP | 2003-264227 | 9/2003 |
| JP | 2005-175460 | 6/2005 |
| JP | 2007-103876 | 4/2007 |
| JP | 2007-533139 | 11/2007 |
| JP | 10-92798 | 4/2010 |
| JP | 10-256260 | 9/2010 |
| KR | 2000-0064946 | 11/2000 |
| WO | WO 2005/101100 | 10/2005 |
| WO | WO2006/083592 | 8/2006 |

OTHER PUBLICATIONS

U.S. Appl. No. 61/027,776, filed Feb. 11, 2008.
U.S. Appl. No. 61/016,369, filed Dec. 21, 2007.
U.S. Appl. No. 12/257,210, filed Oct. 23, 2008.
Search Report dated Jun. 24, 2009 from International Application No. PCT/US2008/086722.
Written Opinion dated Jun. 24, 2009 from International Application No. PCT/US2008/086722.
Search Report dated Apr. 22, 2010 from International Application No. PCT/US2009/060214.
Written Opinion dated Apr. 22, 2010 from International Application No. PCT/US2009/060214.
Search Report dated Apr. 22, 2010 from International Application No. PCT/US2009/060218.
Written Opinion dated Apr. 22, 2010 from International Application No. PCT/US2009/060218.
Office Action dated Apr. 15, 2011 from U.S. Appl. No. 12/338,950.
Notice of Allowance dated Feb. 3, 2012 from U.S. Appl. No. 12/257,210.
Written Opinion dated Mar. 14, 2012 from Singapore Patent Application No. 201004075-6.
Search Report dated Mar. 14, 2012 from Singapore Patent Application No. 201004075-6.
Final Office Action dated May 21, 2012 from U.S. Appl. No. 12/338,950.
Office Action dated Jan. 2, 2013 from U.S. Appl. No. 13/339,301.
Office Action dated Jul. 24, 2012 from Japanese Patent Application No. 2010-539663.
Final Office Action dated Jun. 12, 2013 from U.S. Appl. No. 13/339,301.
Nishino et al., "Damage-free selective etching of Si native oxides using NH3/NF3 and SF6/H2O down-flow etching," Journal of Applied Physics, vol. 74, No. 2, 1993, pp. 1345-1348.
Office Action dated Sep. 14, 2011 from U.S. Appl. No. 12/257,210.
Final Office Action dated Oct. 5, 2011 from U.S. Appl. No. 12/338,950.
Notification of Examination Opinions dated Dec. 26, 2014 from Taiwan Patent Application No. 098135954.

* cited by examiner

SILICON ETCH WITH PASSIVATION USING CHEMICAL VAPOR DEPOSITION

BACKGROUND OF THE INVENTION

The present invention relates to the formation of semiconductor devices. More specifically, the present invention relates to the etching of features into silicon material.

Features such as via holes and trenches are formed in a silicon substrate using anisotropic etching. Sidewall passivation is used in order to protect the sidewalls of the features from lateral etch to achieve anisotropic etch. Substantially vertical profile can be obtained by forming proper sidewalls during silicon etch process. The etch gas typically contains halogen gas (such as $SF_6$) for chemical etching and oxygen ($O_2$) gas for passivation. The passivation layer is typically an oxide film containing silicon oxide (SiOx-based film) formed by oxidation of the feature sidewalls. The composition of the passivation layer may be affected by etch chemistry and mask material. Too much sidewall passivation may cause pinch-off, and too little side wall passivation may cause bowing or undercut or CD (critical dimension) degradation.

Deep features may also be formed in silicon substrates by the use of "rapidly alternating" plasma etch processes (a gas modulation process), which utilize a fast repetition of alternating plasma etch cycle and deposition (passivation) cycle. In general, $SF_6$ and $C_4F_8$ are the principal process gases for the etch and deposition cycles, respectively. A sidewall-protecting polymer layer is deposited during the $C_4F_8$ passivation cycle so as to achieve directional etch. During the $SF_6$ etch cycle, the passivation polymer is removed from horizontal surfaces (such as the bottom of vias) by ion-enhanced etching, and then silicon is etched isotropically from the exposed areas by free fluorine.

In a gas modulation process, the process gases supplied to a plasma processing reactor are rapidly toggled on and off, resulting in the process quickly changing from the etch condition where silicon is removed from the wafer, to the deposition condition where material is deposited onto the wafer and silicon is not removed, and then back again to the etch condition. The duration of the alternating cycles is typically relatively short, and a large number of cycles are typically required to achieve a desired depth into the silicon substrate.

SUMMARY OF THE INVENTION

To achieve the foregoing and in accordance with the purpose of the present invention, in one embodiment, a method for etching a silicon layer through a patterned mask formed thereon is provided. The silicon layer is placed in an etch chamber. A fluorine (F) containing etch gas and a silicon (Si) containing chemical vapor deposition gas are provided in the etch chamber. The fluorine (F) containing etch gas is used to etch features into the silicon layer, and the silicon (Si) containing chemical vapor deposition gas is used to form a silicon-containing deposition layer on sidewalls of the features. A plasma is generated from the etch gas and the chemical vapor deposition gas, and a bias voltage is provided. Features are etched into the silicon layer using the plasma, and a silicon-containing passivation layer is deposited on the sidewalls of the features which are being etched. Silicon in the passivation layer primarily comes from the chemical vapor deposition gas. The etch gas and the chemical vapor deposition gas are then stopped.

In another manifestation of the invention, a method of etching a silicon layer through a patterned mask formed thereon using a downstream plasma is provided. The silicon layer is placed in an etch chamber. A fluorine (F) containing etch gas to etch features into the silicon layer is provided into an upstream plasma chamber. A plasma is generated from the etch gas in the upstream plasma chamber. A reaction medium is flown from the plasma into the etch chamber. A silicon (Si) containing chemical vapor deposition gas is provided into the etch chamber such that the reaction medium includes silicon containing chemical vapor. A bias voltage is provided and features are etched into the silicon layer using the reaction medium, while a silicon-containing passivation layer is deposited on sidewalls of the features which are being etched. Silicon in the passivation layer primarily comes from the chemical vapor deposition gas. Flows of the reaction medium and the chemical vapor deposition gas are then stopped.

In another manifestation of the invention, an apparatus for etching features into a silicon layer through a patterned mask is provided. The apparatus includes a plasma processing chamber, a gas source, and a controller. The plasma processing chamber comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to the at least one electrode, a gas inlet for providing gas into the plasma processing chamber enclosure, and a gas outlet for exhausting gas from the plasma processing chamber enclosure. The gas source in fluid connection with the gas inlet, and includes an etch gas source and a chemical vapor deposition gas source. The controller is controllably connected to the gas source, the RF bias source, and the at least one RF power source, and includes at least one processor and computer readable media having computer readable code for etching the silicon layer. The computer readable code for etching the silicon layer includes (a) computer readable code for flowing a fluorine (F) containing etch gas from the etch gas source into the plasma chamber, (b) computer readable code for flowing a silicon (Si) containing chemical vapor deposition gas from the chemical vapor deposition gas source into the plasma chamber, (c) computer readable code for forming a plasma from the etch gas and the chemical vapor deposition gas, (d) computer readable code for providing a bias voltage, (e) computer readable code for etching features into the silicon layer, (f) computer readable code for depositing a silicon-containing passivation layer on the sidewalls of the features which are being etched such that silicon in the passivation layer primarily comes from the chemical vapor deposition gas, and (f) computer readable code for stopping the etch gas and the chemical vapor deposition gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Applicants used an oxygen-containing gas, such as $O_2$, $SO_2$, $CO_2$, CO as a passivation gas to form an oxide-based passivation layer to protect feature sidewalls during a silicon etch process using a fluorine-containing gas such as $SF_6$ or $NF_3$. The sidewall passivation layer contains $SiO_2$ (if $O_2$ is used); $SiO_x$ (if $SO_2$ is used/added); and/or SiC or SiOC (if $CO_2$ and/or CO are used/added). $N_2O$ or $NO_2$ may also used or added, which results in a passivation layer further containing SiN or SiON. Other gases, such as $B_2H_6$, $BCl_3$ may also be added, where the passivation layer may also contain SiOBN or SiBN.

In those processes, the oxide passivation layer is formed by plasma enhanced oxidation which requires reactions between oxidation agents and silicon surface. That is, the oxide passivation layer is "grown" from the surface of the silicon features by oxidation reaction consuming silicon to the oxide. Such a reaction or growth requires a certain amount of time, i.e., has a time constant. Applicant found a novel method of forming a passivation layer for silicon etching with a substantially smaller time constant.

In accordance with one embodiment of the present invention, a passivation layer for silicon etch is formed by directly depositing a material on the sidewall of the features by chemical vapor deposition. Since such deposition does not require oxidation or surface reaction of feature sidewalls, it is believed that the time constant is much smaller and thus the passivation layer is formed much faster than the conventional passivation. In accordance with one embodiment of the present invention, a silicon containing dielectric layer, such as silicon oxide, silicon nitride, silicon carbide, silicon oxy-nitride, and the like is deposited using chemical vapor deposition. It is believed that forming a passivation layer by chemical vapor deposition, not by surface growth, provides more durable passivation layers. It is also believed the chemical vapor deposition process is more flexible to control the profile of the passivation layer.

Figure 1:
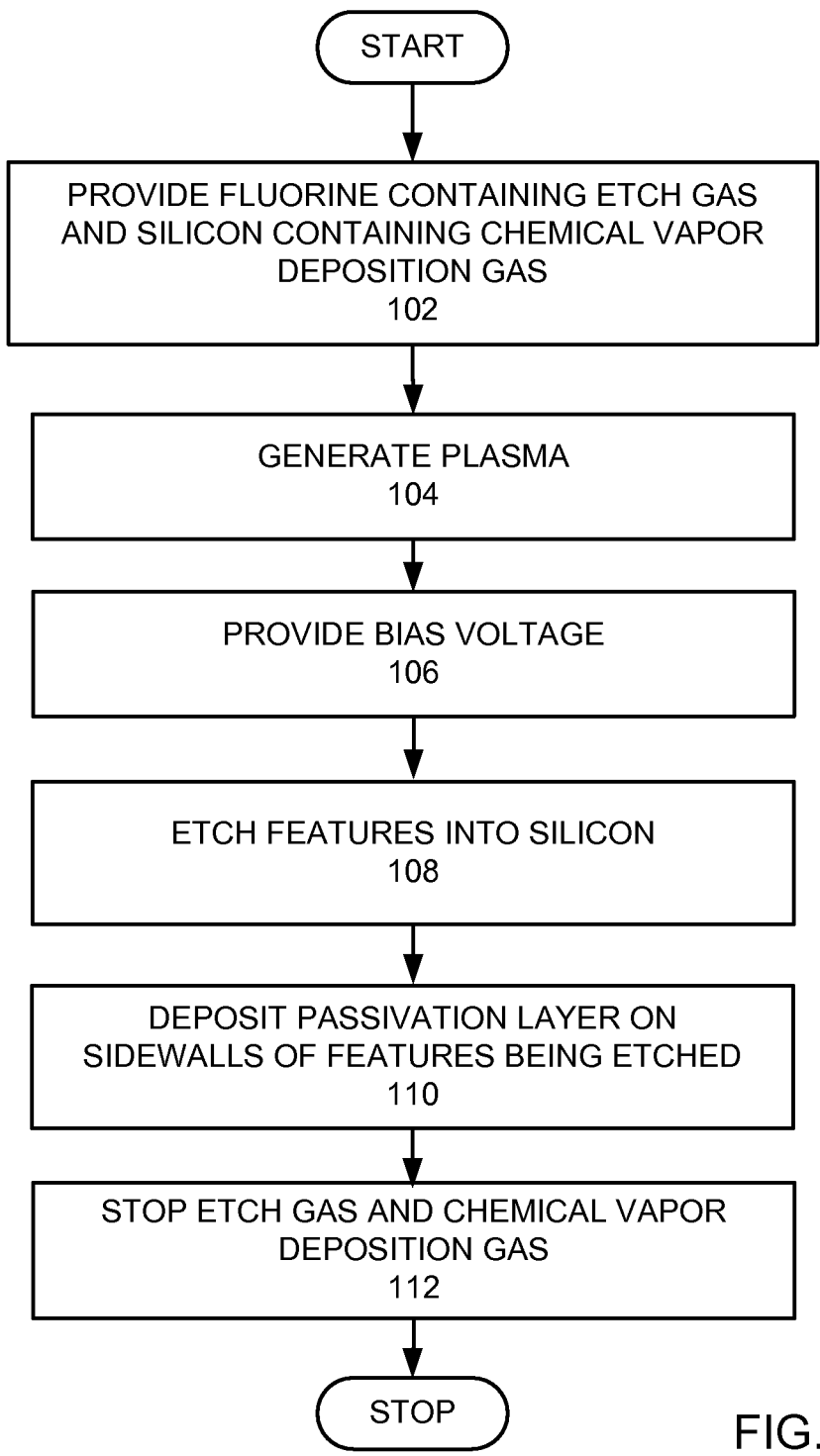
FIG. 1 is a high level flow chart of a process of etching a silicon layer in accordance with an embodiment of the invention.

To facilitate understanding, FIG. 1 is a high level flow chart of a process used in an embodiment of the invention, in which a silicon layer is etched through a patterned mask using an etch chamber. An etch gas containing a fluorine (F) containing gas (fluorine containing etch gas) and a chemical vapor deposition gas containing silicon (Si) containing gas (silicon containing chemical vapor deposition gas) are provided into the etch chamber in which the silicon layer is placed (step 102). A carrier gas and/or diluent gas may be added to the chemistry in order to provide certain reaction effects. The fluorine containing etch gas is provided to etch features into the silicon layer. For example, the fluorine containing etch gas contains $SF_6$. The fluorine containing etch gas may further contain $SiF_4$. In addition, the fluorine containing etch gas may contain $NF_3$ or $CF_4$, or a combination of $SF_6$, $NF_3$, $SiF_4$ and/or $CF_4$. Other halogen-containing gas may also be added to the etch gas. It should be noted that although $SiF_4$ (additive) contains silicon, $SiF_4$ in the etch gas only decreases bowing or undercut of features. The $SiF_4$ additive reduces Si consumption from feature sidewalls by shifting equilibrium of Si atoms, but does not deposit any silicon containing dielectric layer on the sidewalls.

The silicon containing chemical vapor deposition gas (silicon containing gas) is provided to form a silicon-containing deposition layer on sidewalls of the features. For example, the silicon containing chemical vapor deposition gas may contain vapor of silanes (for example, $SiH_4$, more generally, $Si_nH_{2n+2}$), silicates, or siloxanes ($R_2SiO$, where R is a hydrogen atom or a hydrocarbon group). Preferably, the chemical vapor deposition gas includes tetra-ethyl-ortho-silicate (TEOS) vapor or octa-methyl-cyclo-tetra-siloxane (OMCTS) vapor. The chemical vapor deposition gas may also contain additive gas(es). For example, the chemical deposition gas may contain silane and oxygen to deposit oxides, or silane or silicate or siloxane and ammonia to deposit silicon nitride and silicon oxy nitride.

The chemical vapor deposition gas may be premixed with the fluorine containing etch gas before being introduced into the etch chamber. Alternatively, the etch gas and the chemical vapor deposition gas may be introduced from separate gas inlets into the etch chamber where the plasma is generated.

Referring back to FIG. 1, a plasma is generated from the etch gas and the chemical vapor deposition gas (step 104). A bias voltage is provided (step 106) to facilitate anisotropic etching (or etching exclusively on horizontal surfaces), and features are etched into the silicon layer using the plasma (step 108). At the same time, a silicon-containing passivation layer (dielectric layer) is deposited on the sidewalls of the features which are being etched (step 110). The passivation layer thus formed contains $SiO_xC_y$, where x and y are not both zero. Contrary to the conventional surface oxidation in which silicon atoms in the passivation layer come from the silicon material of the features themselves (i.e., the "internal" source), silicon atoms in the passivation layer in accordance with embodiments of the present invention primarily comes from the chemical vapor deposition gas (i.e., the "external" source). In accordance with one embodiment of the present invention, 50% or more of the silicon atoms in the passivation layer originate from the chemical vapor deposition gas. Preferably, 80% or more of the silicon atoms in the passivation layer originate from the chemical vapor deposition gas. More preferably, 95% or more of the silicon atoms in the passivation layer originate from the chemical vapor deposition gas.

Figure 2:
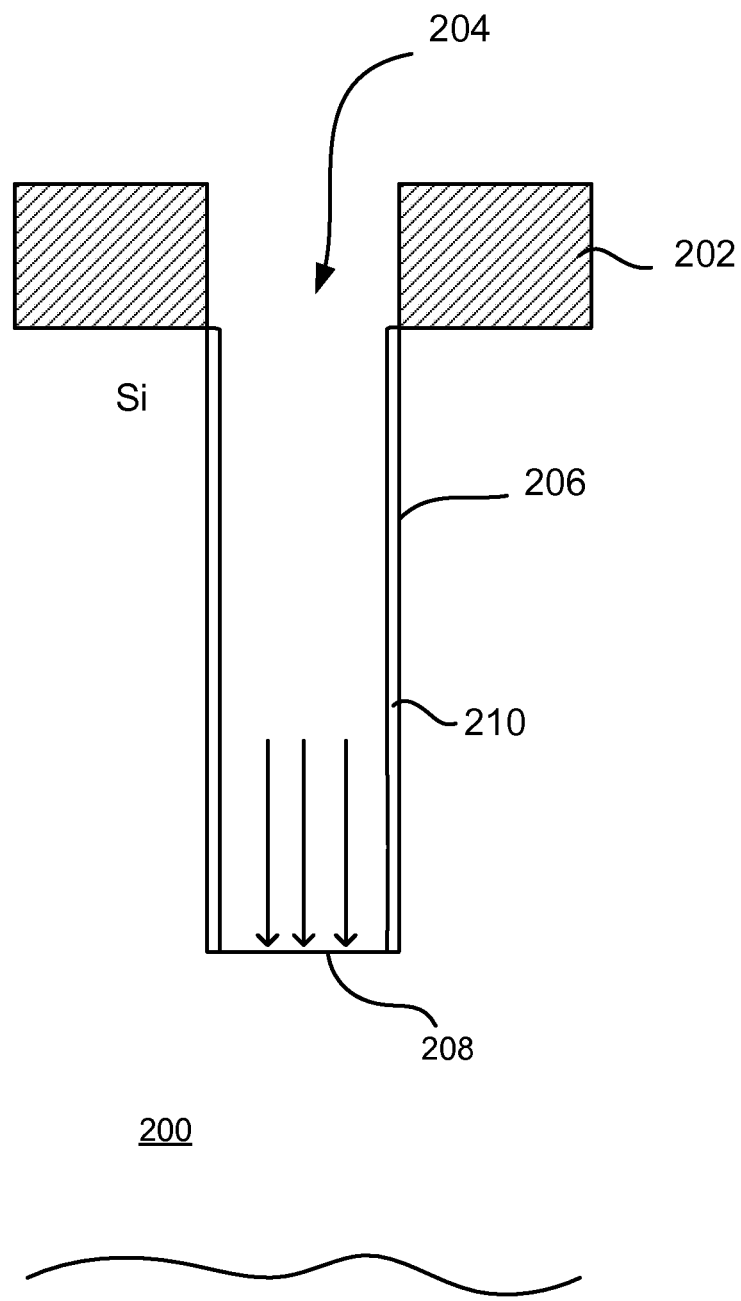
FIG. 2 schematically illustrates an example of a cross-section of a silicon layer in which a feature is being etched, in accordance with one embodiment of the present invention.

To facilitate understanding, FIG. 2 schematically illustrates an example of a cross-section of a silicon layer 200 in which a feature is being etched. The silicon layer 200 may be a silicon wafer. The silicon material may be crystalline silicon, polysilicon, or amorphous silicon. The silicon material may also be doped or strained silicon. A patterned mask 202 is provided over the silicon layer 200, which defines a feature 204 on the silicon material. The mask 202 may be a photoresist (PR) mask or a hard mask (oxide). The mask 202 may also include other layers under the mask, such as a conductive layer and/or a dielectric layer which may have been etched in previous steps (not shown). The feature 204 etched into the silicon material may have a vertical (i.e. substantially 90 degrees) profile angle, as shown in FIG. 2. The feature 204 may have a tapered profile (i.e. a profile angle less than 90 degrees) depending on the application. The silicon etch may be deep silicon etch in which features are etched to a depth ranging from 5 microns to 800 microns, whereas typical thickness of layers of a completed CMOS device is 3 to 5 microns. For example, an aspect ratio of the features may be least 80, or alternatively, the depth of the features may be at least 80 μm. However, the present invention is applicable to any type of silicon etching.

During the etch process, passivation takes place on the sidewalls 206 and the bottom 208 of the feature 204. Since a bias voltage is provided (FIG. 1, step 106), charged particles (ions) bombard the bottom 208 of the feature, but not, or substantially less, on the sidewalls 206. The ion impact on the bottom facilitates chemical reactions leading to etch. Thus, on the sidewalls, deposition of the passivation layer 210 continues to protect the sidewall 206 from the etchant (F) radials from the etch gas. On the other hand, at the bottom 208 of the feature, the passivation layer 210 is being deposited and at the same time being removed by ion assisted etching, and the exposed silicon is etched by radicals. Since the passivation layer is formed much faster than by the conventional surface oxidation of the silicon material, it is believed that the etch process can be performed more efficiently.

After desirable features are etched using the passivation layer, the etch gas and the chemical vapor deposition gas flows are stopped (FIG. 1, step 112).

A high etch efficiency and desired process flexibility may be achieved with a continuous, non-alternating etch process (steady-state) using the etch gas comprising a fluorine containing gas such as $SF_6$, and a silicon containing chemical vapor deposition gas, for example, TEOS vapor. The process is continuous because, even though the supply gas flow set points may change during the process (e.g. ramped from a higher value to a lower value, or vice versa), the etch gas flows are not toggled on and off; rather, the gas supplies remain on continuously while the feature 204 is etched into the silicon layer 200. The process is non-alternating because it does not change from an "etch" condition to a "deposition" condition; rather, etching of the silicon and inhibition of etching (passivation) occur simultaneously during the etch processes. The etch efficiency of such a continuous process may be significantly improved over a rapidly alternating process because silicon is being removed during 100% of the total process time. In addition, because the gas flows are continuous, standard hardware such as gas flow controllers may be used, thus reducing the cost and complexity of the system needed to support the process.

An example of a steady-state silicon etch process uses an etch gas containing $SF_6$ and a chemical vapor deposition gas containing OMCTS vapor with 2500 W of TCP power, and 250 W bias voltage. The process gas flow may include 900 sccm $SF_6$, 20 sccm OMCTS vapor, and optionally, 100 sccm $O_2$, and 50 sccm $SiF_4$ at 80 mTorr. Wafer chuck temperature is set at 0° C.

In addition, process performance and flexibility of the continuous etch process may be enhanced by changing typical process parameters such as plasma power, wafer bias power, process chamber pressure, or the like, during the continuous etch process. For example, the plasma power supply, and/or the wafer bias voltage may be pulsed in an on/off or high/low fashion in order to balance the ratio of neutral to charged reactive plasma components reaching the wafer. In another example, the plasma power, the wafer bias power, and/or the pressure in the plasma processing chamber may be ramped from a high value to a low value, or vice versa, during the continuous etch process.

Figure 3:
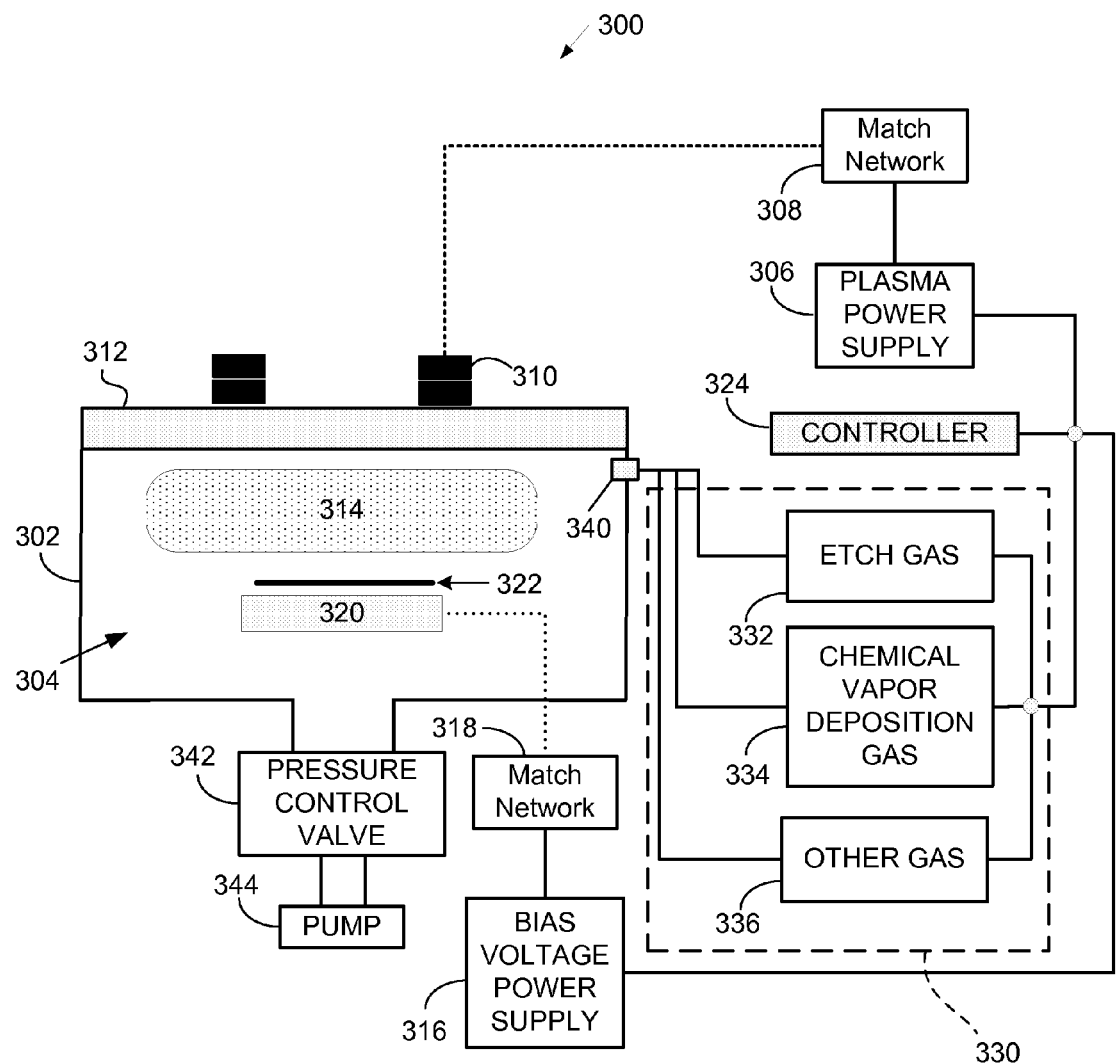
FIG. 3 is a schematic view of an example of a plasma processing system which may be used to carry out an embodiment of the invention.

FIG. 3 schematically illustrates an example of a plasma processing system 300 which may be used to perform the process of etching a silicon layer in accordance with one embodiment of the present invention. The plasma processing system 300 includes a plasma reactor 302 having a plasma processing chamber 304 therein. A plasma power supply 306, tuned by a match network 308 supplies power to a TCP coil (the primary winding of a transformer) 310 located near a window 312 to create a plasma 314 in the plasma processing chamber 304. The coil (upper power source) 310 may be configured to produce a uniform diffusion profile within processing chamber 304. For example, the TPC coil 310 may be configured to generate a toroidal power distribution in the plasma 314. The window 312 is provided to separate the TPC coil 310 from the plasma chamber 304 while allowing energy to pass from the TPC coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz. Plasma power supply 306 and wafer bias power supply 316 may be appropriately sized to supply a range of powers in order to achieve desired process performance. For example, in one embodiment of the present invention, the plasma power supply 306 may supply the power in a range of 500 to 6000 Watts, and the wafer bias voltage power supply 316 may supply a bias voltage of in a range of 20 to 1000 V. In addition, the TPC coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes an etch gas source 332, a chemical vapor deposition gas source 334, and optionally, an additional gas source 336. The gas sources 332, 334, and 336 are in fluid connection with processing chamber 304 through a gas inlet 340. The gas inlet 340 may be located in any advantageous location in chamber 304, and may take any form for injecting gas, such as a single nozzle or a showerhead. Preferably, however, the gas inlet 340 may be configured to produce a "tunable" gas injection profile, which allows independent adjustment of the respective flow of the gases to multiple zones in the process chamber 304. It should be noted that, although FIG. 3 only illustrates a single gas inlet 340, the etch gas and the chemical vapor deposition gas may be introduced into the process chamber from separate gas inlets (not shown), as well as the same gas inlet 340. The separate gas inlets may be provided to different locations of the process chamber 304, and the locations of the gas inlets may be adjusted in order to optimize the etch and chemical vapor deposition processes. For example, the location of the gas inlets may be determined so as to reduce any extraneous deposition. It should be noted that the present invention is not limited to a specific design or configuration of the process chamber 304 or the plama processing system 300. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324.

The plasma processing system 300 may also include a window cooling system (not shown) to reduce the temperature gradient across the window 312 and to reduce the overall operating temperature of window 312.

Figure 4:
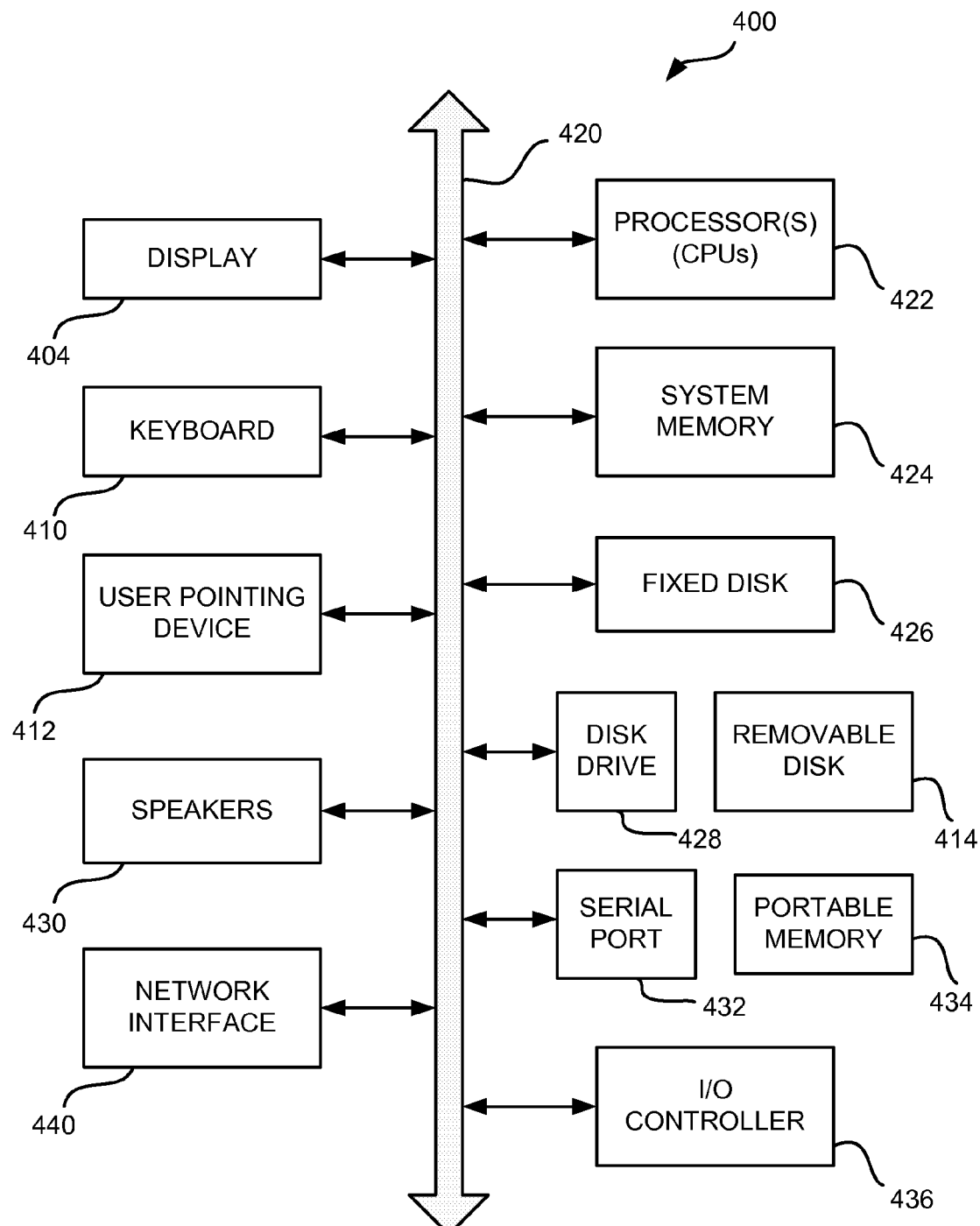
FIG. 4 illustrates a computer system, which is suitable for implementing a controller used in embodiments of the invention.

FIG. 4 schematically illustrates a block diagram of a computer system 400 suitable for implementing a controller 324 (in FIG. 3), which may be used in one or more embodiments of the present invention. The computer system 400 may have many physical forms ranging from an integrated circuit, a printed circuit board, and a small handheld device up to a huge super computer. In the computer system 400 attached to system bus 420 is a wide variety of subsystems. Processor(s) 422 (also referred to as central processing units, or CPU's) are coupled to storage devices, including a system memory 424. The memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable kind of the computer-readable media described below. A fixed disk 426 is also coupled bi-directionally to the CPU 422; it provides additional data storage capacity and may also include any of the computer-readable media described below. The fixed disk 426 may be used to store programs, data, and the like and is typically a secondary storage medium (such as a hard disk) that is slower than primary storage. It will be appreciated that the information retained within the fixed disk 426 may, in appropriate cases, be incorporated in standard fashion as virtual memory in the memory 424. A removable disk 414 may be used via a disk drive 428 to transfer data to and from the computer system 400. The removable disk 414 may take the form of any of the computer-readable media described below. A portable memory 434 such as a USB flash drive may also be used via a serial port 432.

The CPU 422 is also coupled to a variety of input/output devices, such as a display 404, a keyboard 410, a user pointing device 412 such as a computer mouse, speakers 430, and an input/output (I/O) controller 436. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. The CPU 422 may be coupled to another computer or telecommunications network using network interface 440. With such a network interface, it is contemplated that the CPU 422 might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

The computer system 400 may be configured to collect and store relevant process data such as gas flows, pressures, temperature, power, and the like, in order to diagnose the plasma processing system and to control the plasma process.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

Figure 5:
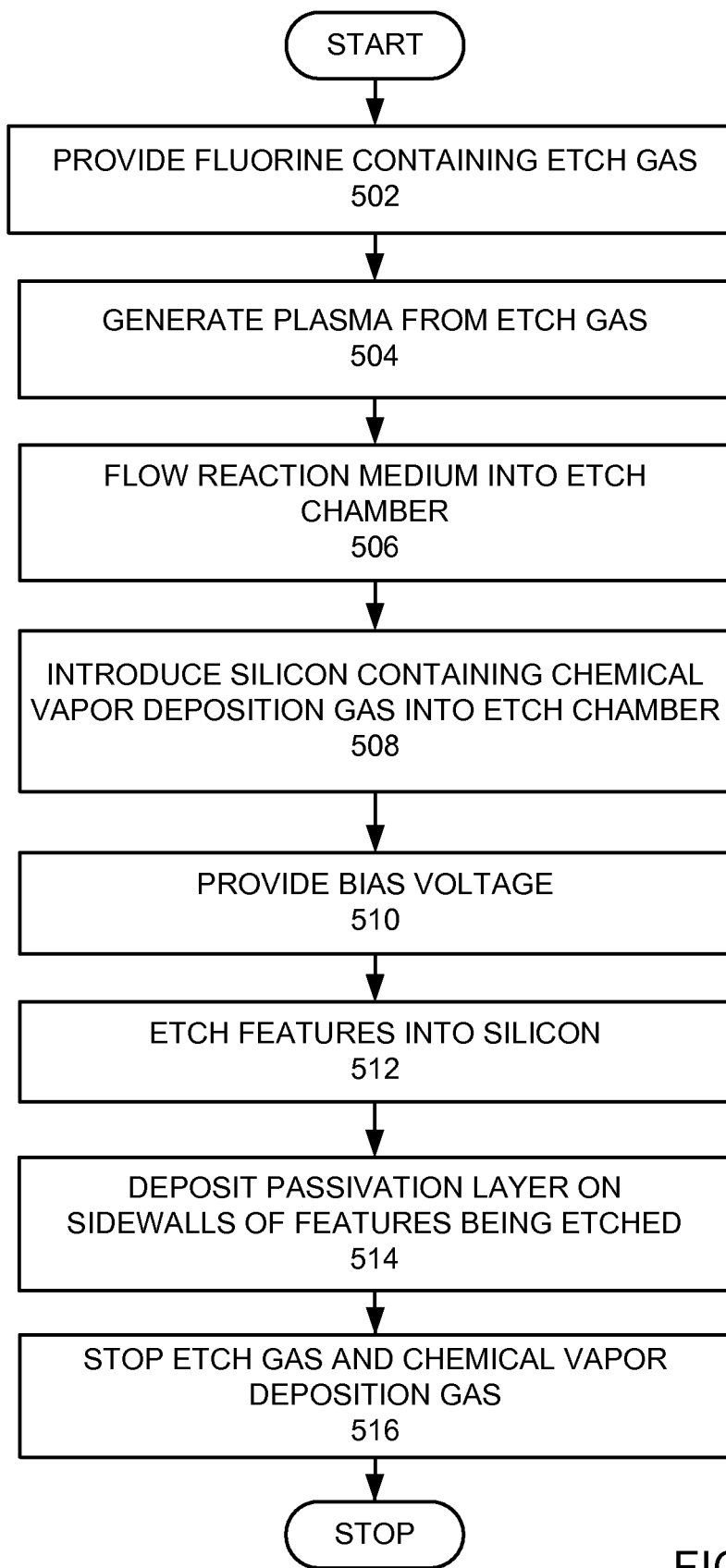
FIG. 5 is a high level flow chart of a process of etching a silicon layer in accordance with another embodiment of the invention.
Figure 6:
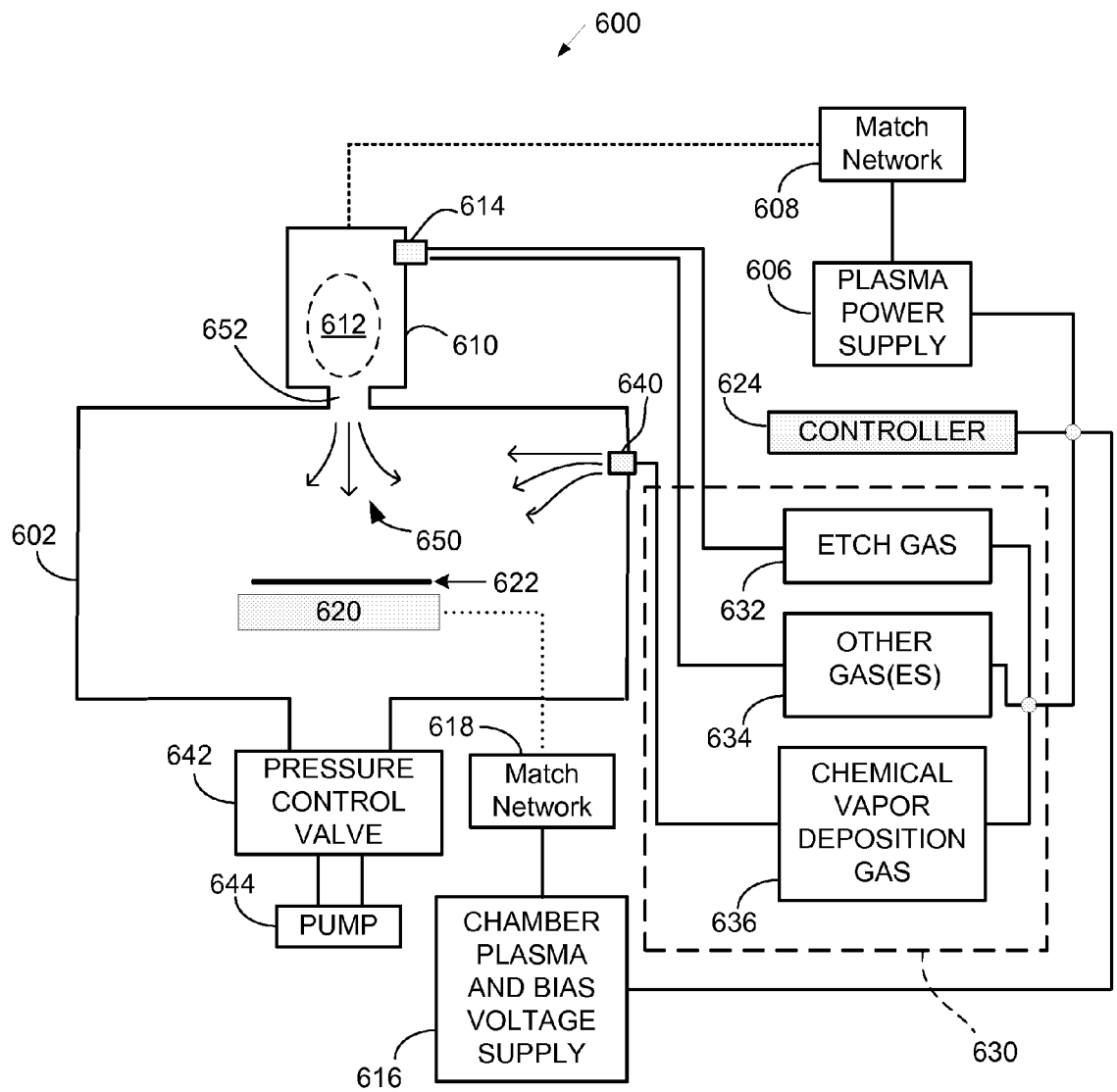
FIG. 6 is a schematic view of an example of a downstream plasma processing system which may be used to carry out an embodiment of the invention.

In accordance with another embodiment of the present invention, a downstream plasma chamber is used for etching a silicon layer, and the chemical vapor deposition gas flow may be introduced downstream of the plasma. FIG. 5 schematically illustrates a process used in an embodiment of the invention, in which a silicon layer is etched through a patterned mask using a downstream plasma chamber. FIG. 6 schematically illustrates an example of a downstream plasma processing system 600 which may be used to perform the process of etching a silicon layer in accordance with this embodiment of the present invention.

As shown in FIG. 6, the downstream plasma processing system 600 includes an etch chamber 602 and a plasma chamber 610. A plasma power supply 606, tuned by a match network 608 supplies power to the plasma chamber 610 located on the top of the etch chamber 602. The plasma chamber 610 may energize a plasma 612 using RF power or microwave. A reaction medium (etchant medium) 650 flows from the plasma 612 into the etch chamber 602 through a port 652. A wafer based plasma source and bias voltage power supply 616 provides plasma and bias voltage. The power supply 616, which is tuned by a match network 618, provides power to an electrode 620 to set the bias voltage on a wafer 622 which is supported by the electrode 620. A controller 624 sets points for the plasma power supply 606 and the wafer based plasma source and bias voltage supply 616. The controller 624 may be implemented using the computer system 400 (FIGS. 4A and 4B) described above. In addition, the wafer based plasma source and bias voltage power supply 616 may provide one or more frequencies. For example, 13.56 MHz alone, 27 MHz with 2 MHz, and 27 MHz or higher (such as 60 MHz) with 400 kHz may be used. The wafer based plasma source and bias voltage power supply 616 may include two separate generators: a higher frequency generator as the plasma source, and the other with a lower frequency as the bias voltage source.

The downstream plasma processing system 600 further includes a gas source/gas supply mechanism 630. The gas source includes an etch gas source 632, a chemical vapor deposition gas source 636, and optionally, an additional gas source 634. The fluorine containing gas source 632 and additional gas source (optional) 634 are in fluid connection with the plasma chamber 610 through a gas inlet 614. The etch gas source 632 is in fluid connection with the etch chamber 602 through another gas inlet 640. The gas inlets 614 and 640 may be located in any advantageous location in the plasma chamber 610 and the etch chamber 602, respectively, and may take any form for injecting gas, such as a single nozzle or a showerhead. Preferably, however, the gas inlets 614 and 640 may be configured to produce a "tunable" gas injection profile, which allows independent adjustment of the respective flow of the gases. It should be noted that, the location of the gas inlets 614 and 640 are not limited to those illustrated in FIG.

6. The locations of the gas inlets 614 and 640 may be adjusted in order to optimize the etch and chemical vapor deposition processes. For example, the location of the gas inlet 640 may be determined so as to reduce any extraneous deposition. It should be noted that the present invention is not limited to a specific design or configuration of the process chamber 602 or the plama processing system 600. The process gases and byproducts are removed from the etch chamber 602 via a pressure control valve 642 and a pump 644, which also serve to maintain a particular pressure within the etch chamber 602. The gas source/gas supply mechanism 630 is controlled by the controller 624.

As shown in FIG. 5, a fluorine containing etch gas is provided into the upstream plasma chamber 610 (step 502), and a plasma 612 is generated from the etch gas (step 504). The etch gas may contain other components similarly to the previous embodiments, which may be provided from the additional gas source 634. A reaction medium 650 from the plasma 612 is transported into the etch chamber 602 (step 506). The reaction medium 650 contains radicals and ions. A silicon containing chemical vapor deposition gas (for example, TEOS or OMCTS) is introduced into the etch chamber 602 through the inlet 640 (step 508) such that the reaction medium 650 contains silicon containing gas vapor. Chamber (wafer based) plasma power and bias voltage are provided (step 510), and features are etched into the silicon layer (step 512), while a silicon-containing passivation layer (dielectric layer) is deposited from the silicon containing gas vapor on the sidewalls of the features which are being etched (step 514). Then, the reaction medium and the chemical vapor deposition gases are stopped (step 516).

In accordance with one embodiment of the present invention, the passivation using chemical vapor deposition is applied to a gas modulation process, which consists of iterative alternative deposition and etching steps. Generally, the etching step uses an etch gas containing $SF_6$, and the deposition step uses a deposition gas containing $C_4F_8$ which deposits a carbon-based passivation layer including C—C bonds. Applicant used a small amount of $SiF_4$ as additive to produce C—Si bonds to modify characteristics of the carbon-based passivation layer. The chemical vapor deposition in accordance with one embodiment of the present invention can be applied to this deposition step so as to deposit a silicon containing oxide-based passivation layer, rather a carbon-based passivation layer. A silicon-containing chemical vapor deposition gas, for example, TEOS or OMCTS, is used in place of $C_4F_8$ deposition gas. Alternatively, a hybrid process of the rapid alternating process and a steady-state process may be used. This hybrid process alternates between two phases (sub-processes): 1) overall etch phase which is rich in $SF_6$ (or similar silicon etchant) and does have some silicon passivating compound; and 2) overall deposition process, rich in silicon passivating gas but with some $SF_6$ for slow etch. It is believed that using a silicon-containing chemical vapor deposition reduces the time of the deposition/passivation step and/or provides further control of the sidewall profile.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching a silicon layer through a patterned mask formed thereon using an etch chamber in which the silicon layer is placed, the method comprising:
   providing a fluorine (F) containing etch gas to etch features into the silicon layer and a silicon (Si) containing chemical vapor deposition gas to form a silicon-containing deposition layer on sidewalls of the features by premixing the etch gas and the chemical vapor deposition gas, the chemical vapor deposition gas containing siloxane vapor;
   generating a plasma from the etch gas and the chemical vapor deposition gas;
   providing a bias voltage;
   etching features into the silicon layer using the plasma through the patterned mask;
   depositing, using the plasma, a silicon-containing passivation layer on the sidewalls of the features which are being etched, wherein silicon in the passivation layer primarily comes from the chemical vapor deposition gas; and
   stopping the etch gas and the chemical vapor deposition gas,
   wherein the method is performed in a steady state such that the etching of the silicon layer and the depositing of the silicon-containing passivation layer occur simultaneously in a non-alternating manner.

2. The method according to claim 1, wherein said depositing the silicon-containing passivation layer includes:
   providing silicon atoms from the chemical vapor deposition gas to form the silicon-containing passivation such that substantial part of silicon atoms in the passivation layer originates from the chemical vapor deposition gas.

3. The method according to claim 2, wherein silicon atoms in the passivation layer originated from the chemical vapor deposition gas is 50% or more of total silicon atoms in the passivation layer.

4. The method according to claim 3, wherein silicon atoms in the passivation layer originated from the chemical vapor deposition gas is 80% or more of total silicon atoms in the passivation layer.

5. The method according to claim 4, wherein silicon atoms in the passivation layer originated from the chemical vapor deposition gas is 95% or more of total silicon atoms in the passivation layer.

6. The method according to claim 1, wherein said depositing the silicon-containing passivation layer includes:
   depositing the passivation layer containing Si, O, and C.

7. The method according to claim 1, wherein the chemical vapor deposition gas includes:
   tetora-ethyl-ortho-silicate (TEOS) vapor.

8. The method according to claim 1, wherein the chemical vapor deposition gas further includes at least one of:
   silane vapor; and
   silicate vapor.

9. The method according to claim 1, wherein in said simultaneously-occurring etching and depositing, the silicon-containing passivation layer being deposited on a bottom of the features is also being etched at a same time so as to expose the silicon layer such that the silicon layer is being etched to continue forming the features, while the silicon-containing passivation layer deposited on the sidewalls of the features protects the sidewalls from etchant radicals from the etch gas.

10. A method of etching a silicon layer through a patterned mask formed thereon using an etch chamber in which the silicon layer is placed, the method comprising:

providing a fluorine (F) containing etch gas to etch features into the silicon layer and a silicon (Si) containing chemical vapor deposition gas to form a silicon-containing deposition layer on sidewalls of the features by premixing the etch gas and the chemical vapor deposition gas;
generating a plasma from the etch gas and the chemical vapor deposition gas;
providing a bias voltage;
etching features into the silicon layer using the plasma through the patterned mask;
depositing, using the plasma, a silicon-containing passivation layer on the sidewalls of the features which are being etched, wherein silicon in the passivation layer primarily comes from the chemical vapor deposition gas; and
stopping the etch gas and the chemical vapor deposition gas,
wherein the method is performed in a steady state such that the etching of the silicon layer and the depositing of the silicon-containing passivation layer occur simultaneously in a non-alternating manner,
wherein the chemical vapor deposition gas includes: octa-methyl-cyclo-tetra-siloxane (OMCTS) vapor.

11. A method of etching a silicon layer through a patterned mask formed thereon using an etch chamber in which the silicon layer is placed, the method comprising:
providing a fluorine (F) containing etch gas to etch features into the silicon layer into an upstream plasma chamber;
generating a plasma from the etch gas in the upstream plasma chamber;
flowing the plasma from the upstream plasma chamber into the etch chamber;
providing a silicon (Si) containing chemical vapor deposition gas separately from the plasma into the etch chamber, the silicon containing chemical vapor deposition gas being introduced downstream of the plasma so as to form a reaction medium including the plasma and silicon containing chemical vapor;
providing a bias voltage;
etching features into the silicon layer through the patterned mask using the reaction medium;
depositing, using the reaction medium, a silicon-containing passivation layer on sidewalls of the features which are being etched into the silicon layer, wherein silicon in the passivation layer primarily comes from the chemical vapor deposition gas; and
stopping flows of the reaction medium and the chemical vapor deposition gas.

12. The method according to claim 11, wherein the method is performed in a steady state such that the etching of the silicon layer and the depositing of the silicon-containing passivation layer occur simultaneously in a non-alternating manner.

13. The method according to claim 12, wherein in said simultaneously-occurring etching and depositing, the silicon-containing passivation layer being deposited on a bottom of the features is also being etched at a same time so as to expose the silicon layer such that the silicon layer is being etched to continue forming the features, while the silicon-containing passivation layer deposited on the sidewalls of the features protects the sidewalls from etchant radicals from the etch gas.

14. The method according to claim 11, wherein the chemical vapor deposition gas includes:
octa-methyl-cyclo-tetra-siloxane (OMCTS) vapor.

15. The method according to claim 11, wherein the plasma flows from the upstream plasma chamber into the etch chamber through a port provided therebetween, the port connecting the upstream plasma chamber and the etch chamber.

\* \* \* \* \*